United States Patent
Chen et al.

[19]

[11] Patent Number: 5,924,010
[45] Date of Patent: Jul. 13, 1999

[54] METHOD FOR SIMULTANEOUSLY FABRICATING SALICIDE AND SELF-ALIGNED BARRIER

[75] Inventors: Shu-Jen Chen, Hsinchu; Jiunn-Hsien Lin, Yung Kang; Chih-Ching Hsu, Feng Shan, all of Taiwan

[73] Assignee: United Microelectronics Corp., Hsinchu, Taiwan

[21] Appl. No.: 08/740,512

[22] Filed: Oct. 30, 1996

[51] Int. Cl.$^6$ .................................................. H01L 21/28
[52] U.S. Cl. ........................ 438/653; 438/655; 438/656; 438/683
[58] Field of Search ................................... 438/592, 630, 438/649, 651, 643, 653, 655, 664, 683

[56] References Cited

U.S. PATENT DOCUMENTS

| | | | |
|---|---|---|---|
| 5,162,262 | 11/1992 | Ajika et al. | 438/649 |
| 5,240,880 | 8/1993 | Hindman et al. | 438/656 |
| 5,242,860 | 9/1993 | Nulman et al. | 438/653 |
| 5,451,545 | 9/1995 | Ramaswami et al. | 438/649 |

OTHER PUBLICATIONS

Wolf, S., Silicon Processing for the VLSI Era, vol. 2, 1990, Lattice Press, pp. 121–128, 143–152.
Wolf, S., Silicon Processing for the VLSI Era, vol. 1, 1986, Lattice Press, pp. 514–520.

*Primary Examiner*—T. N. Quach
*Attorney, Agent, or Firm*—Bacon & Thomas, PLLC

[57] ABSTRACT

A method of fabricating salicide and self-aligned barrier simultaneously is disclosed. The initial steps include sputtering a metal stack (Ti—TiN—Ti) and forming a salicide layer by thermally reacting the metal stack and the wafer followed by a chemical etching which removes the unreacted portions of the metal stack. The portions of the metal stack on Si can react with Si to form a TiSi$_2$ layer, thus forming TiSi$_2$—TiN—TiSi$_2$. The TiSi$_2$ layer over the TiN layer acts as a mask in the chemical etching and protects the TiN layer from been etched. The diffusion barrier layer is thus formed simultaneously within the fabricating of salicide.

9 Claims, 4 Drawing Sheets

METHOD FOR SIMULTANEOUSLY FABRICATING SALICIDE AND SELF-ALIGNED BARRIER

BACKGROUND OF THE INVENTION

1. Field of the Invention

The present invention relates to a method of fabricating salicide and self-aligned barrier simultaneously. The fabricating of thin film Ti silicide is difficult and the surface is rough in the prior art whereas the present invention provides a method to overcome these problems. Because Si and Al intermix with each other, 'spike' is thus formed penetrating source/drain region. In order to form the barrier layer to prevent the mixture, the prior art ether deposits TiN or utilize Ti nitridation. The former can hardly control the thickness of TiN in contact hole while the later must utilize another RTP to generate TiN, both may decrease the yield. The present invention utilize RTP only once and TiN is deposited all over Ti film so the thickness of TiN is easily controlled and the yield would not be decreased.

2. Description of the Prior Art

The conventional contact structure using a self-aligned silicide is described as following sequences of processes:

1. After the source and drain regions have been implanted to form the source/drain junctions, the poly-Si sidewall spacers 110 are formed (FIG. 1*a*).The spacer is made of $SiO_2$. Note that side wall oxidation structures along the gate (known as oxide spacers 110) are used to prevent the gate and source/drain areas from being electrically connected. Following the silicide formation, a selective etch removes the unreacted metal without attacking the silicide.

2. The metal used to form the silicide is deposited all over the topography to form a film 120 of metal which can be Ti, Co or Ni . . . etc. (FIG. 1*b*)

3. The wafer 125 is heated by rapid thermal process (RTP), which causes the silicide reaction to occur wherever the metal film is in contact with the silicon. The configuration mentioned above is shown as 130*a* in FIG. 1*c*. The metal remains unreacted everywhere else and is shown as 130*b* in FIG. 1*c*.

4. The unreacted metal is selectly removed through the use of an etchant that dose not attack the silicide, the silicon substrate, or the $SiO_2$. As a result, each exposed source and drain region is now completely covered by silicide, but there is no film elsewhere (FIG. 1*d*).

5. A dielectric layer is deposited onto the silicide, and contact holes are opened in it down to the silicide layer.

6. Deposit a layer of titanium all over the topography by DC magnetron sputtering followed by a process of RTP in the chamber that containing $N_2$ or $NH_3$. A diffusion barrier layer—TiN is thus formed over the silicide and is shown as TiN layer 160 in FIG. 1*e* and dielectric layer mentioned in the previous step is shown as dielectric layer 150 in FIG. 1*e*.

The implement of TiN layer can utilize the other method: Sputtering deposit TiN into contact hole 155 shown in FIG. 1*g* to form the TiN layer 165. The advantage is the spare of RTP, whereas, especially when the contact size is small, it is hard to control the thickness of TiN layer 165 in the contact hole by sputtering deposition.

7. Having deposited W-plug into the contact holes over the TiN layer, metal-Al is deposited over W-plug and the TiN layer. By etching the unwanted part of aluminum, the unwanted TiN layer is removed too. Thus the Al layer is made in contact with the suicide through W-plug and the Al conducting line is shown as 170 in FIG. 1*f*.

The configuration mentioned above is called salicide, wherever $TiSi_2$ and $CoSi_2$ are attractive for the salicide application because it exhibits low resistivity, and because it can reduce native-oxide layers (making it the only known refractory metal that can reliably form a silicide on both polycrystalline and single-crystal silicon through a thermal reaction). Therefore $TiSi_2$ and $COSi_2$ are widely used in the salicide application nowadays. Furthermore, devices fabricated with titanium silicide on the gate electrode are more resistant to high-field-induced hot-electron degradation than are conventional poly-Si gate devices. It is conjectured that the $TiSi_2$ and $COSi_2$ are effective getteres for the hydrogen atoms introduced during the hydrogen annealing. Less hydrogen is thus incorporated into the gate oxide, and this improves the hot-electron reliability.

On the other hand, to prevent the widely used silicide material-Ti from intermixing with interconnect metal-Al, diffusion barrier layer-TiN is deposited between these two kinds of metal. The TiN layer can be formed by sputtering from a TiN target in an inert or by the procedure of rapid thermal process (RTP) of Ti in an nitrogen ambient. The procedure is sophisticated, especially, and it is hard to control the thickness of the diffusion barrier layer owing to the contact size. Besides, in some application utilizing high aspect ratio contact process (e.g. the process of DRAM . . . etc.), it is hard to form enough thickness of diffusion barrier layer-TiN, so that the difficulty of the successive processes is raised. Furthermore, in the conventional process forming thinner Ti film and narrower gate-source/drain region, it is difficult to form Ti silicide and the resistivity of the Ti silicide is hard to reduce. In addition, the surface of silicide is rough and the dielectric layer over silicide is thus rough too. In wiring processes, it is desirable that the dielectric layers have a smooth surface topography, since it is difficult to lithographically image and pattern layers applied to rough surface. Also, rough surface topography results in poor step coverage by subsequently deposited layers, discontinuity of layers across steps, and void formation between topographic features. Poor step coverage by deposited layers and void formation between topographic features result in degraded process yield and poorer reliability of integrated circuits. In addition, RTP is used twice in the prior art, because the thermal control is still not perfect, the yield maybe decreases.

SUMMARY OF THE INVENTION

A method for simultaneously fabricating salicide and self-aligned barrier layer is disclosed in the present invention. The metal stack Ti—TiN—Ti is formed all over the topography of the wafer and reacts with silicon atoms to generate another silicide stack $TiSi_2$—TiN—$TiSi_2$. Thus the salicide and self-aligned barrier layer TiN is formed simultaneously. Furthermore the process generating $TiSi_2$—TiN—$TiSi_2$ utilizes RTP only once so the throughput can be raised. Since the passive barrier layer TiN is formed by sputtering deposition over the Ti film instead of in the contact hole, it is easy to control the thickness of TiN layer. In addition, the top-layered $TiSi_2$ acts as a sacrificial barrier layer and is combined with the passive barrier layer TiN to act as diffusion barrier layer. The barrier layer of the present invention is stronger than that of the prior art. Further, the processes that forming the metal stack can be performed in the same site so that the process is less sophisticated.

BRIEF DESCRIPTION OF THE DRAWINGS

The above features of the present invention will be more clearly understood from consideration of the following descriptions in connection with accompanying drawings in which:

FIG. 1a is a cross-sectional view of a wafer that with the oxide spacers formed along the gate.

FIG. 1b is a cross-sectional view of a wafer that with titanium deposited all over the topography of the wafer.

FIG. 1c is a cross-sectional view of a wafer that with specific regions of titanium reacted with underlying silicon atoms contained layers to form $TiSi_2$ layers.

FIG. 1d is a cross-sectional view of a wafer that with the unreacted titanium etched and the regions containing $TiSi_2$ left.

FIG. 1e and FIG. 1g individually is a cross-sectional view of a wafer: that dielectric layer is deposited all over the topography with contact hole opened and diffusion barrier layer is formed all over the topography and into the contact hole respectively.

FIG. 1f is a cross-sectional view of a wafer that with Al conductor lines deposited over the deposited W-plug.

FIG. 2a is a cross-sectional view of a wafer that with the oxide spacers formed along the gate.

FIG. 2b shows the metal stack all over the topography of wafer. The metal stack is Ti—TiN—Ti.

FIG. 2c shows that the silicide is formed after RTP and some portions of TiTiN—Ti become $TiSi_2$—TiN—$TiSi_2$.

FIG. 2d shows that the unreacted portions of Ti—TiN—Ti structure is etched by RCA clean whereas the $TiSi_2$TiN—$TiSi_2$ structure is left.

FIG. 2e shows that the dielectric layer is deposited over the whole wafer and the contact holes are opened followed by W-plug is sputter deposited into those holes.

FIG. 2f shows that the Al conducting lines are deposited over the W plugs with the unwanted portions of Al etched.

DESCRIPTION OF THE PREFERRED EMBODIMENT

According to the present invention, an improved method of simultaneously fabricating the self-aligned silicide and barrier layer is described. This technique finds particular application in the processing of silicon wafers for integrated circuit chips. Accordingly, the invention will be described for this particular application.

Figure 1A:
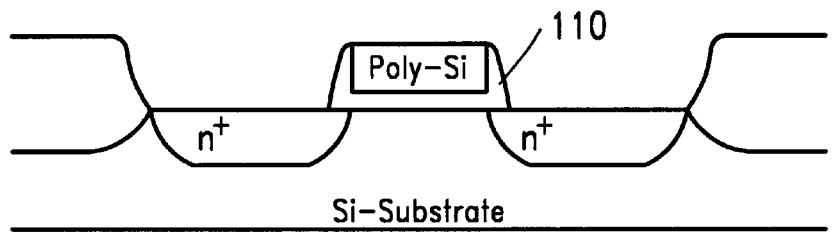
FIG. 1a–FIG. 1f show the sequence of processes how the salicide and diffusion barrier layer is formed in the prior art.
Figure 1B:
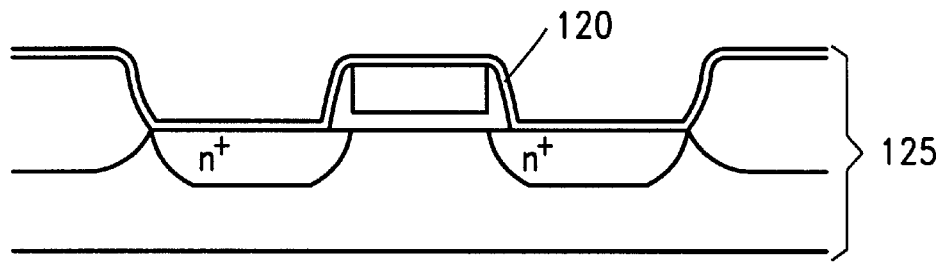
Figure 1C:
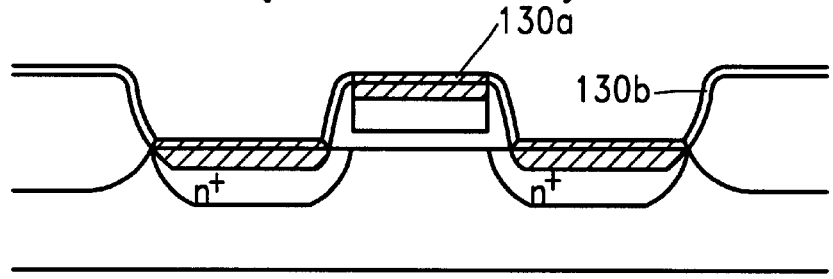
Figure 1D:
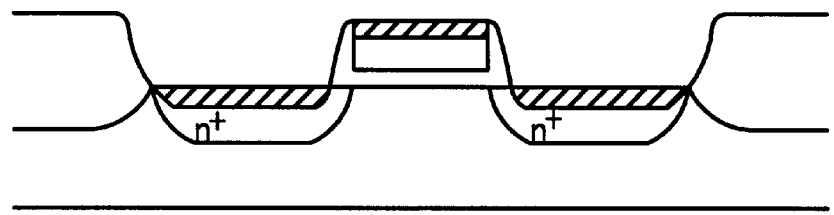
Figure 1E:
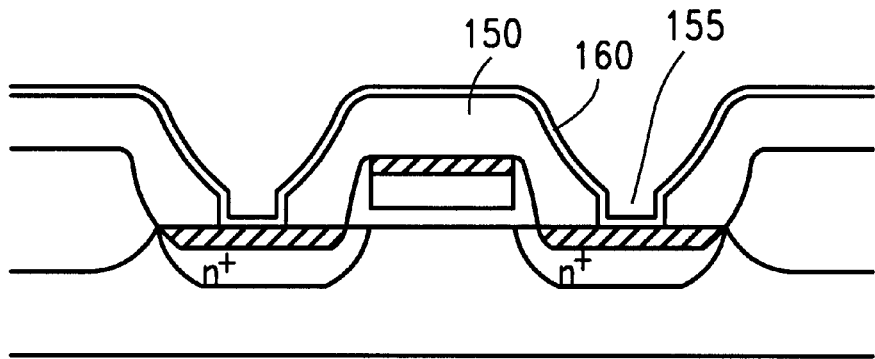
Figure 1F:
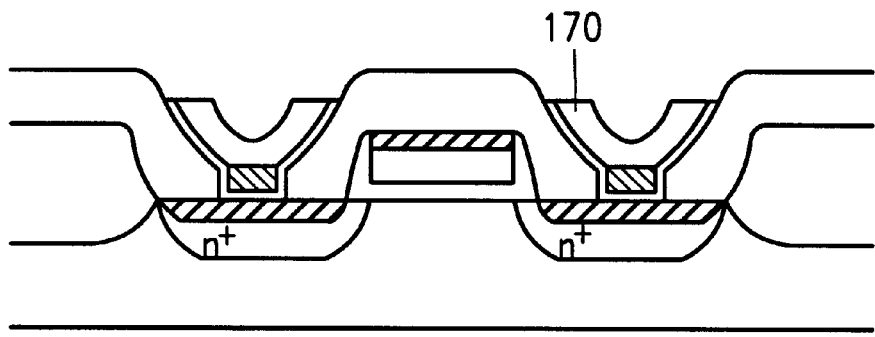
Figure 1G:
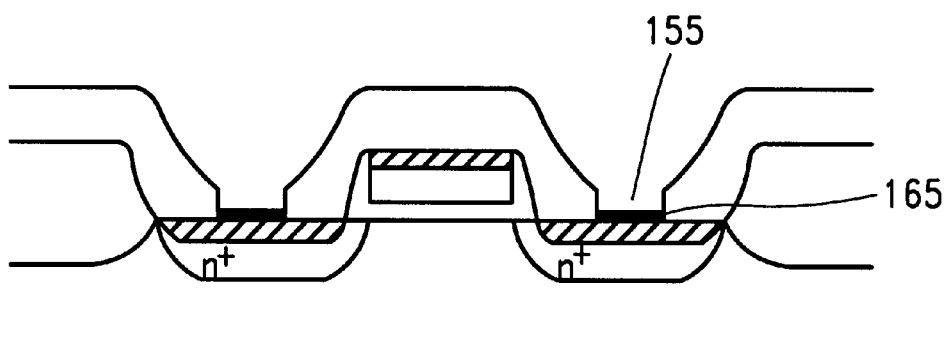
FIG. 1g shows the other method of forming diffusion barrier layer.
Figure 2A:
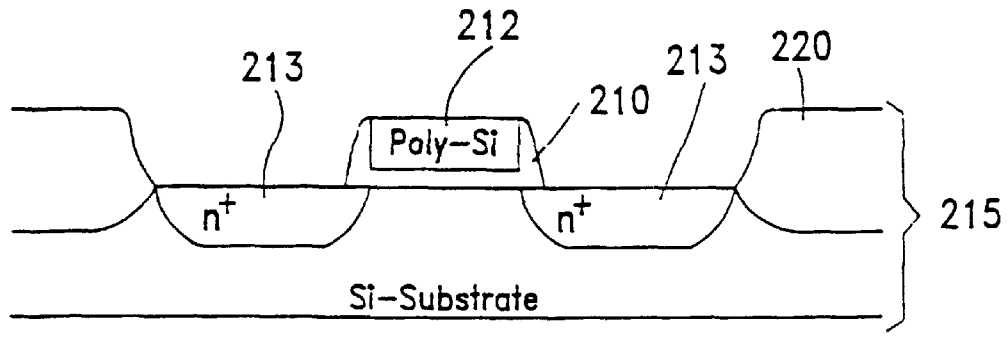
FIG. 2a–FIG. 2f shows the sequence of processes how the salicide and diffusion barrier layer is formed.
Figure 2B:
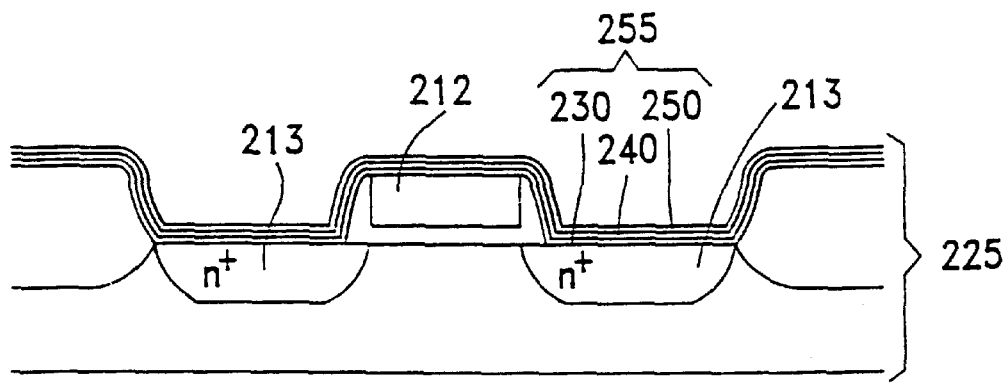

Referring now to the drawings, FIG. 2a shows a section through the silicon wafer 215 after the initial processing steps. The spacer 210 is formed along the gate electrode 212, which composed of poly-Si. The source/drain electrode 213 is composed of n-type silicon whereas the spacer 210 and field oxide 220 is composed of $SiO_2$. Referring to FIG. 2b, using a sputtering method to deposit a Ti-film 230 (film 230 can be made of Ti, Co or Ni . . . etc., and Ti is employed in this preferred embodiment) over the topography of the wafer 225, followed by sputtering to deposit a TiN-film 240 over the Ti-film 230. Finally a Ti-film 250 is deposited by sputtering over the TiN-film 240. The thickness of the Ti-film 230 is about 200–500 angstroms. The thickness of the TiN-film 240 is about 300–1000 angstroms and the thickness of the Ti-film 250 is about 200–500 angstroms the metal stack 255 is thus formed all over the wafer 225 which containing the regions underlying Si and $SiO_2$. Note that the film 240 is always TiN or TiW whatever film 230 and film 250 are.

Figure 2C:
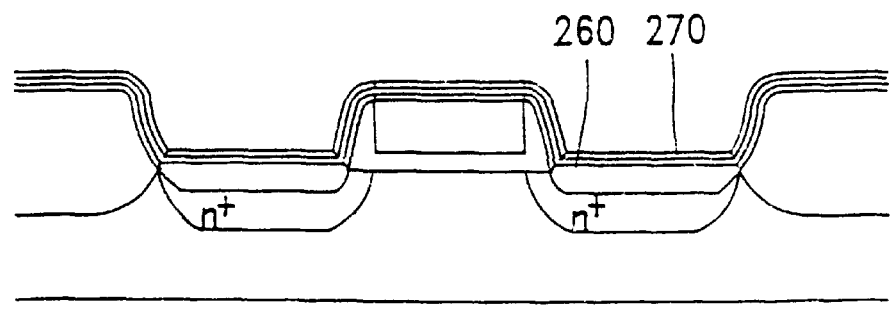

Following the previous process, a RTP is performed by heating the wafer 225 at about 600°–800° C. for 20 seconds. The Si atoms in the gate electrode 212 and source/drain region 213 are driven into Ti-film 230 and reacted with Ti to produce $TiSi_2$, thus the $TiSi_2$-film 260 is formed. Some of the previously mentioned Si atoms are driven through TiN-film 240 into Ti-film 250 and reacted with Ti to produce $TiSi_2$, thus the $TiSi_2$-film 270 is formed. The metal stack on spacer 210 or field oxide 220 is remained unreacted while the other is $TiSi_2$—TiN—$TiSi_2$. The cross-sectional view is shown in FIG. 2c.

Figure 2D:
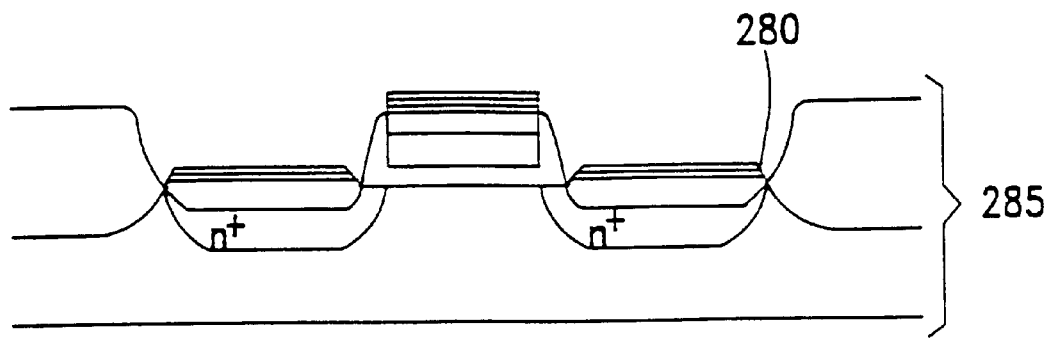

The unwanted region Ti—TiN—Ti can be etched by RCA clean while metal stack 280 $TiSi_2$—TiN—$TiSi_2$ is left as shown in FIG. 2d. It is clear that the self-aligned silicide (salicide) and self-aligned barrier layer are formed simultaneously and are contained in the metal stack 280 $TiSi_2$—TiN—$TiSi_2$.

The RCA clean is performed by: preparing a fresh mixture of $H_2O$—$NH_4OH$—$H_2O_2$ by 5:1:1 (in volume) and then heating the mixture to 75°–80° C. The wafer 285 is submarged completely into the mixture for 10–15 minutes, and is maintained at 80° C.

Figure 2E:
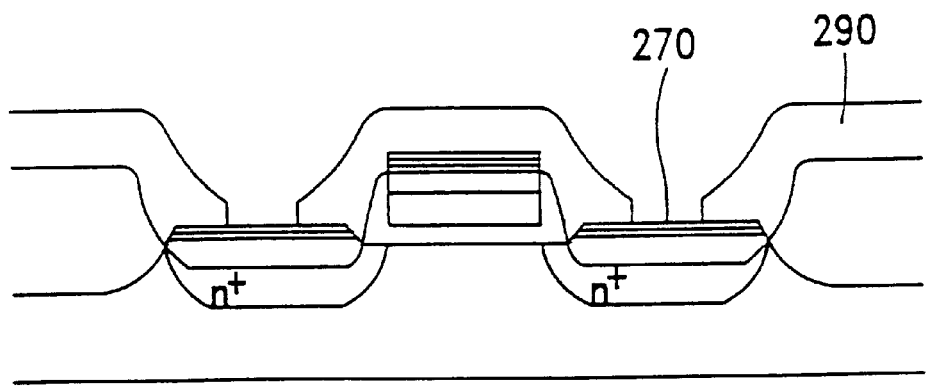

Followed by the previous step, a chemical vapor deposition of doped $SiO_2$ occurred. Referring to FIG. 2e, the dielectric layer is phosphosilicate glass (PSG) so the deposition of doped $SiO_2$ utilizes a reaction of silane; oxygen; and phospine to form PSG films. The reactions are given by:

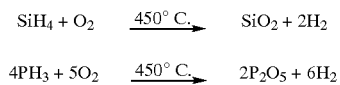

$$SiH_4 + O_2 \xrightarrow{450°\,C.} SiO_2 + 2H_2$$

$$4PH_3 + 5O_2 \xrightarrow{450°\,C.} 2P_2O_5 + 6H_2$$

Figure 2F:
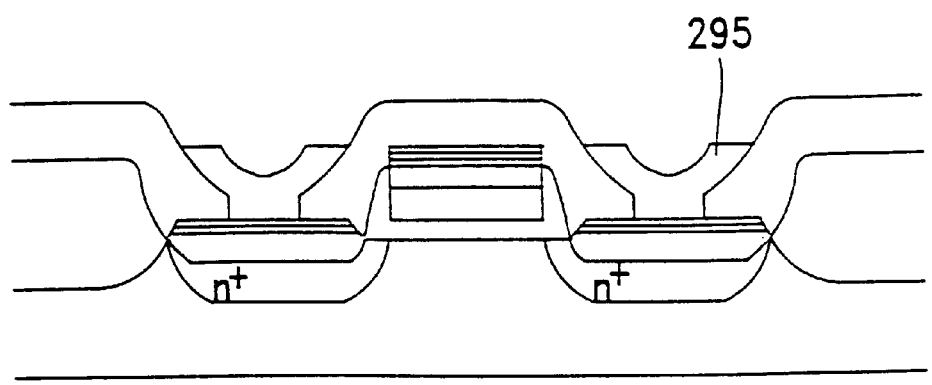

The reaction can be formed by CVD or LPCVD and the temperature must maintained in the range 300°–500° C. Followed by the deposition of PSG layer, the contact hole is then opened by the following steps: 1) photoresist is spun on the previous mentioned wafer followed by the process of exposure . . . etc to form the pattern; 2) use the liquid mixtures of $H_2O$ and HF at the ratio of 100:1 as an etchant to etch contact holes; 3): strip the pattern formed previously. Because the top-layered $TiSi_2$ 270 acts as an etching stop, the contact hole is thus formed easily. The configuration is shown in FIG. 2e. The resulting wafer is deposited on a thin film of aluminum and then is spun on the photoresist. In which the aluminum film is produced by the method of sputtering deposition. After a wafer has been coated with the photoresist and suitably soft-baked, it is ready to be exposed to some form of radiation in order to create a latent image in the photoresist, the pattern is thus formed. To form the aluminum conducting line, an etchant consists by the ratio $HNO_3$: $CH_3COOH$: $H_3PO_4$: $H_2O$=1:4:4:1 is applied to remove those portions of aluminum film without the photoresist on them. Been stripped of the pattern, the result is shown in FIG. 2f. Because the RTP is used only once in the present invention whereas it is used twice in the prior art, the yield of the prior art is lower than the present invention.

The top-layered $TiSi_2$ 270 acts as a sacrificial barrier layer because the Si atoms may diffuse into Al conducting line. While the Si atoms of bottom-layered $TiSi_2$ is retarded by TiN film, the TiN is often called passive barrier layer. Passive barrier layer TiN and sacrificial barrier layer $TiSi_2$ is called barrier layer, and the strength of this barrier layer is stronger than that in the prior art.

Although specific embodiments have been illustrated and described it will be obvious to those skilled in the art that various modification may be made without departing from the spirit which is intended to be limited solely by the appended claims.

What is claimed is:

1. A method for simultaneously forming silicide and a barrier layer on silicon regions separated by oxide regions on a wafer comprising the steps of:

forming a metal stack over said silicon regions and said oxide regions on said wafer, said metal stack comprising: a first metal film, a metal compound film on said first metal film, and a second metal film on said metal compound film, said first metal film is about 200 to 500 angstroms in thickness, said metal compound film is about 300 to 1000 angstroms in thickness;

forming said silicide layer in said metal stack by thermally reacting said metal stack and said silicon regions on said wafer, said silicide layer being formed by heating said wafer at about 600°–800° C. for 20 seconds to drive silicon atoms in said silicon regions into said first metal film and said second metal film, said first metal layer reacting with said silicon atoms to generate said silicide layer, said silicon atoms driven through said metal compound film reacting with said second metal film to generate a sacrificial silicide layer, said sacrificial silicide layer and said metal compound film being said barrier layer; and removing unreacted portions of said metal stack on said oxide regions, said suicide layer and said barrier layer being aligned to said silicon regions.

2. The method as claim 1, wherein said first metal film and said second metal film are selected in the group consist of: Ti, Co and Ni.

3. The method of claim 2, wherein said second metal film is about 200–500 angstroms in thickness.

4. The method of claim 1, wherein the unreacted portions of said metal stack are removed by completely immerging said wafer into a mixture of temperature about 75° to 80° C. for 10 to 15 minutes, said mixture comprising $H_2O$—$NH_4OH$—$H_2O_2$ by 5:1:1 (in volume).

5. A method for simultaneously forming silicide and a barrier layer on silicon regions separated by oxide regions on a wafer comprising the steps of:

forming a metal stack over said silicon regions and said oxide regions on said wafer, wherein said metal stack is formed comprising following steps of: forming a first Ti film; forming a metal compound film on said first Ti film; and forming a second Ti film on said metal compound film, said first Ti film is about 200 to 500 angstroms in thickness, said metal compound film is about 300 to 1000 angstroms in thickness;

forming said silicide layer in said metal stack and said wafer by thermally reacting said metal stack and said silicon regions on said wafer, said silicide layer being formed by heating said wafer at about 600°–800° C. for 20 second to drive silicon atoms in said silicon regions into said first Ti film and said second Ti film, said first metal layer reacting with said silicon atoms to generate said silicide layer, said silicon atoms driven through said metal compound film reacting with said second Ti film to generate a sacrificial silicide layer, said sacrificial silicide layer and said metal compound film being said barrier layer; and removing unreacted portions of said metal stack on said oxide regions, said silicide layer and said barrier layer being aligned to said silicon regions.

6. The method of claim 5, wherein said second Ti film is about 200–500 angstroms in thickness.

7. The method of claim 5, wherein the unreacted portions of said metal stack are removed by completely immerging said wafer into a mixture of temperature about 75° to 80° C. for 10 to 15 minutes, said mixture comprising $H_2O$—$NH_4OH$—$H_2O_2$ by 5:1:1 (in volume).

8. The method of claim 5, wherein said metal compound film is a titanium nitride (TiN) film.

9. The method of claim 5, wherein said metal compound film is a titanium taustang (TiW) film.

* * * * *